(12) United States Patent
Manthena et al.

(10) Patent No.: US 11,437,391 B2
(45) Date of Patent: Sep. 6, 2022

(54) METHODS OF FORMING MICROELECTRONIC DEVICES, AND RELATED MICROELECTRONIC DEVICES AND ELECTRONIC SYSTEMS

(71) Applicant: Micron Technology, Inc., Boise, ID (US)

(72) Inventors: Raja Kumar Varma Manthena, Boise, ID (US); Anilkumar Chandolu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 16/921,192

(22) Filed: Jul. 6, 2020

(65) Prior Publication Data

US 2022/0005822 A1    Jan. 6, 2022

(51) Int. Cl.
*H01L 27/11565* (2017.01)
*H01L 27/11519* (2017.01)
(Continued)

(52) U.S. Cl.
CPC .... *H01L 27/11565* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
None
See application file for complete search history.

(56) References Cited

U.S. PATENT DOCUMENTS 9,230,905 B2   1/2016   Takaki et al.
9,553,101 B2   1/2017   Kim et al.
(Continued)

FOREIGN PATENT DOCUMENTS

KR   10-2018-0095499 A   8/2018
WO      2016/093947 A1    6/2016
WO      2020/103082 A1    5/2020

OTHER PUBLICATIONS

International Search Report for Application No. PCT/US2021/037096, dated Sep. 30, 2021, 3 pages.
(Continued)

*Primary Examiner* — Hsien Ming Lee
(74) *Attorney, Agent, or Firm* — TraskBritt

(57) ABSTRACT

A method of forming a microelectronic device comprises forming a stack structure. Pillar structures are formed to vertically extend through the stack structure. At least one trench and additional trenches are formed to substantially vertically extend through the stack structure. Each of the additional trenches comprises a first portion having a first width, and a second portion at a horizontal boundary of the first portion and having a second width greater than the first width. A dielectric structure is formed within the at least one trench and the additional trenches. The dielectric structure comprises at least one angled portion proximate the horizontal boundary of the first portion of at least some of the additional trenches. The at least one angled portion extends at an acute angle to each of a first direction and a second direction transverse to the first direction. Microelectronic devices and electronic systems are also described.

26 Claims, 11 Drawing Sheets

(51) Int. Cl.
  *H01L 27/11524*   (2017.01)
  *H01L 27/11582*   (2017.01)
  *H01L 27/11556*   (2017.01)
  *H01L 27/1157*    (2017.01)
  *H01L 27/11573*   (2017.01)
  *H01L 27/11529*   (2017.01)

(56) References Cited

U.S. PATENT DOCUMENTS

| | | |
|---|---|---|
| 2011/0284943 A1 | 11/2011 | Hwang et al. |
| 2013/0134377 A1* | 5/2013 | Park .................. H01L 27/249 |
| | | 257/E27.005 |
| 2013/0313631 A1 | 11/2013 | Yang et al. |
| 2015/0255481 A1 | 9/2015 | Baenninger et al. |
| 2015/0318301 A1 | 11/2015 | Lee et al. |
| 2016/0141419 A1 | 5/2016 | Baenninger et al. |
| 2017/0179153 A1 | 6/2017 | Ogawa et al. |
| 2019/0027494 A1 | 1/2019 | Fukuzumi et al. |

OTHER PUBLICATIONS

Written Opinion of the International Searching Authority for Application No. PCT/US2021/037096, dated Sep. 30, 2021, 4 pages.
Chandolu et al., U.S. Appl. No. 16/532,035, titled Methods of Forming Microelectronic Devices, and Related Microelectronic Devices and Electronic Systems, filed Aug. 5, 2019.

\* cited by examiner

METHODS OF FORMING MICROELECTRONIC DEVICES, AND RELATED MICROELECTRONIC DEVICES AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the conductive stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the conductive stack structure(s) of the memory device. The staircase structure includes individual "steps" defining contact regions of the conductive structures, upon which conductive contact structures can be positioned to provide electrical access to the conductive structures.

Unfortunately, as feature packing densities have increased and margins for formation errors have decreased, conventional methods of forming memory devices (e.g., NAND Flash memory devices) have resulted in undesirable current leaks (e.g., access line to source plate current leaks) and short circuits that can diminish desired memory device performance, reliability, and durability. For example, conventional methods of partitioning a preliminary stack structure including tiers of insulative structures and additional insulating structures into blocks and sub-blocks may result in undesirable conductive material depositions during subsequent processing of the preliminary stack structure (e.g., so called "replace gate" or "gate last" processing of the preliminary stack structure to replace one or more portions of the additional insulating structures with conductive structures to form the conductive stack structure of a memory device) that can effectuate undesirable leakage currents and short circuits. Further, conventional methods of forming the memory devices have resulted in undesirable tier deformations (e.g., tier warping) and/or tier collapse during the formation of the conductive structures.

Accordingly, there remains a need for new methods of forming microelectronic devices (e.g., memory devices, such as 3D NAND Flash memory devices) alleviating the problems of conventional methods of forming microelectronic devices, as well as for new microelectronic device configurations resulting from the new methods, and new electronic systems including the new microelectronic device configurations.

DETAILED DESCRIPTION

Figure 1A:
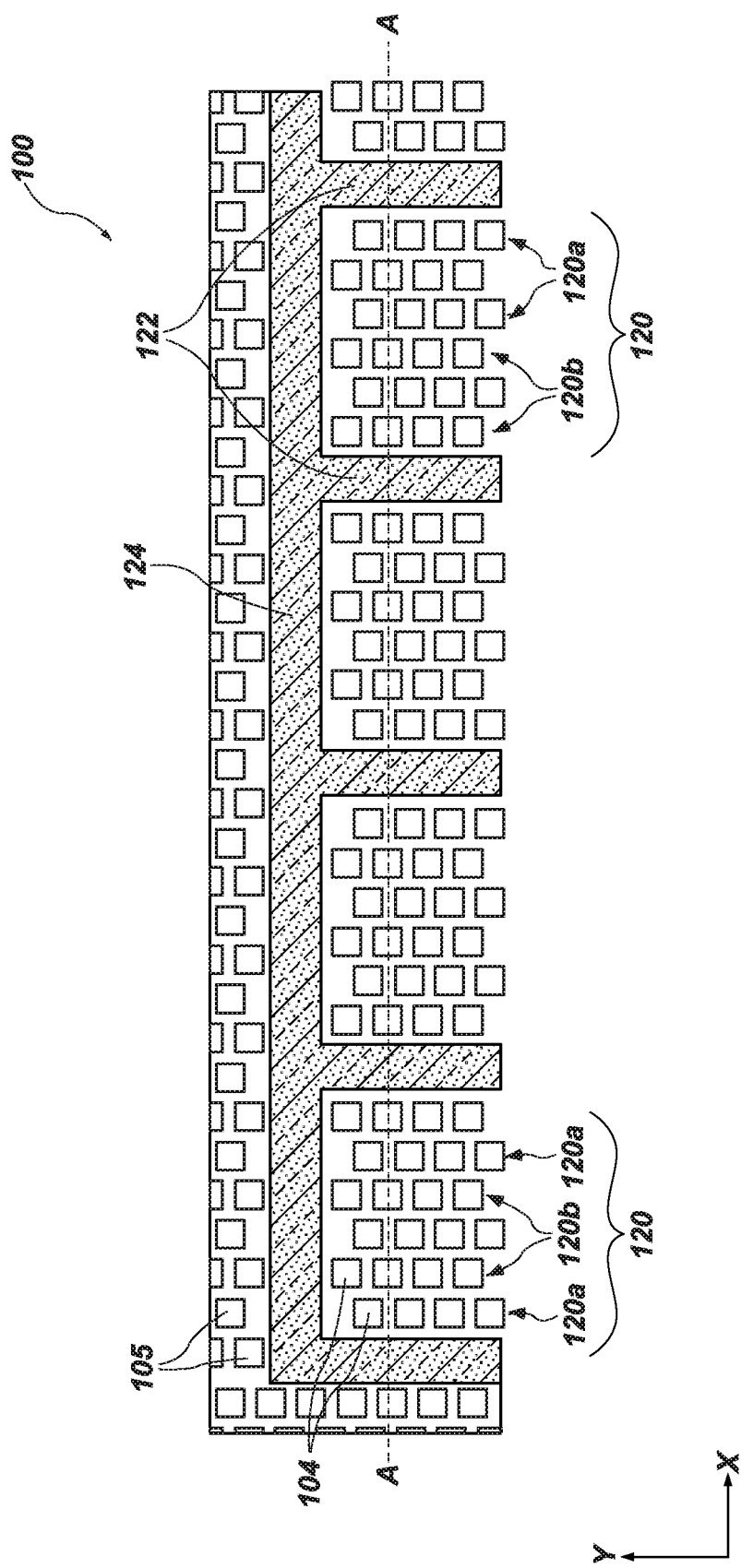
FIGS. 1A through 4B are simplified partial top-down (i.e., FIGS. 1A, 2A, 3A, and 4A) and simplified partial cross-sectional (i.e., FIGS. 1B, 2B, 3B, and 4B) views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, a "memory device" means and includes a microelectronic device exhibiting memory functionality, but not necessary limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "intersection" refers to a point at which two or more features (e.g., regions, structures, materials, trenches, devices) or, alternatively, two or more portions of a single feature meet. For example, the intersection may be the point at which a first feature extending in a first horizontal direction (e.g., an X-direction) and a second feature extending in a second horizontal direction (e.g., a Y-direction) transverse to the first horizontal direction meet. By way of non-limiting example, the features may exhibit differing shapes within the intersection, such as an "L" shape, a "T" shape, or a "Y" shape. Accordingly, the intersection may be referred to as an L-shaped intersection, a T-shaped intersection, or a Y-shaped intersection, for example.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" refers to a distance between identical points in two adjacent (i.e., neighboring) features.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 4B are simplified partial top-down (i.e., FIGS. 1A, 2A, 3A, and 4A) and simplified partial cross-sectional (i.e., FIGS. 1B, 2B, 3B, and 4B) views illustrating embodiments of a method of forming a microelectronic device structure of a microelectronic device (e.g., a memory device, such as a 3D NAND Flash memory device). With the description provided below, it will be readily apparent to one of ordinary skill in the art that the methods and structures described herein may be used in various devices. In other words, the methods of the disclosure may be used whenever it is desired to form a microelectronic device. For convenience in describing FIGS. 1A through 4B, a first direction may be defined as a direction, shown in FIGS. 1A through 4B, as the X-direction. A second direction, which is transverse (e.g., orthogonal, perpendicular) to the first direction, is shown in FIGS. 1A, 2A, 3A, and 4A, as the Y-direction. A third direction, which is transverse (e.g., orthogonal, perpendicular) to each of the first direction and the second direction, may be defined as a direction (e.g., vertical direction), shown in FIGS. 1B, 2B, 3B, and 4B, as the Z-direction. Similar directions are defined, as shown in FIGS. 5A through 5D and FIG. 6, as discussed in greater detail below.

Referring to FIG. 1A, a microelectronic device structure 100 may be formed to include a preliminary stack structure 102 (FIG. 1B) including first pillar structures 104 and second pillar structures 105 extending vertically through the preliminary stack structure 102. The first pillar structures 104 may be separated from the second pillar structures 105 by at least one second trench region 124 extending in a first horizontal direction (e.g., in the X-direction). Neighboring blocks of the first pillar structures 104 may be horizontally separated from one another by first trench regions 122 extending in a second horizontal direction (e.g., in the Y-direction). The first pillar structures 104 may be horizontally aligned in columns 120 extending in the second horizontal direction. The preliminary stack structure 102 and the columns 120 of the first pillar structures 104 are described in further detail below, along with additional components (e.g., structures, features) of the microelectronic device structure 100 at the processing stage depicted in FIG. 1A.

Figure 1B:
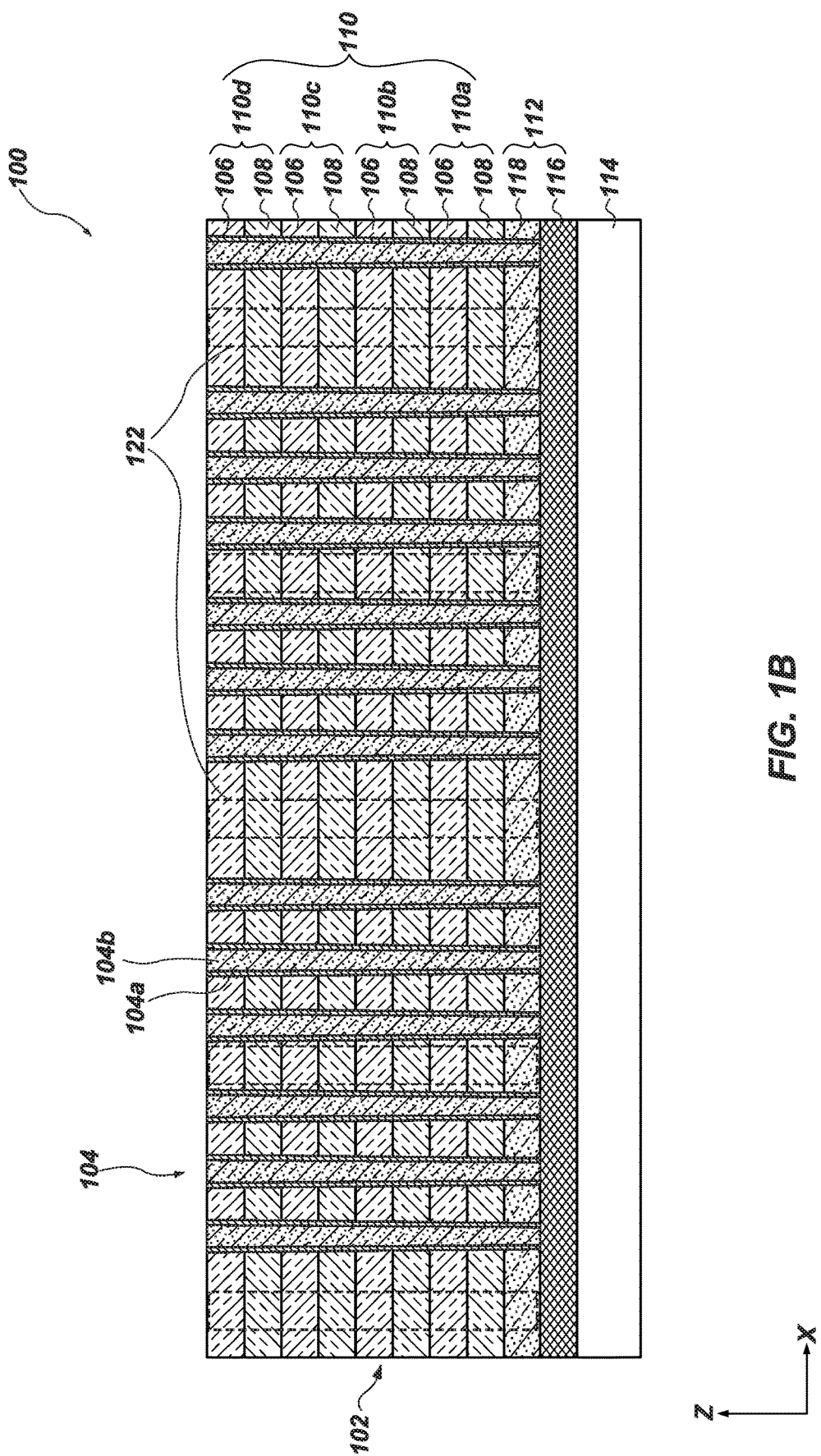

FIG. 1B is a simplified partial cross-sectional view of the microelectronic device structure 100 about the line A-A shown in FIG. 1A. For clarity and ease of understanding of the drawings and related description, not all features depicted in one of FIGS. 1A and 1B are depicted in the other of FIGS. 1A and 1B.

Referring to FIG. 1B, the preliminary stack structure 102 may be formed to include a vertically alternating (e.g., in the Z-direction) sequence of insulating structures 106 and additional insulating structures 108 arranged in tiers 110. Each of the tiers 110 may include one of the insulating structures 106 and one of the additional insulating structures 108 vertically adjacent the insulating structure 106. For clarity and ease of understanding of the drawings and related description, FIG. 1B shows the preliminary stack structure 102 as including four (4) tiers 110 (e.g., a first tier 110a, a second tier 110b, a third tier 110c, a fourth tier 110d) of the insulating structures 106 and the additional insulating structures 108. However, the preliminary stack structure 102 may include a different number of tiers 110. For example, in additional embodiments, the preliminary stack structure 102 may include greater than four (4) tiers 110 (e.g., greater than or equal to ten (10) tiers 110, greater than or equal to twenty-five (25) tiers 110, greater than or equal to fifty (50) tiers 110, greater than or equal to one hundred (100) tiers 110) of the insulating structures 106 and the additional insulating structures 108, or may include less than four (4) tiers 110 (e.g., less than or equal to three (3) tiers 110) of the insulating structures 106 and the additional insulating structures 108.

The insulating structures 106 may be formed of and include at least one dielectric material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulating structures 106 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. Each of the insulating structures 106 may individually include a substantially homogeneous distribution or a substantially heterogeneous distribution of the at least one dielectric material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. In some embodiments, each of the insulating structures 106 exhibits a substantially homogeneous distribution of dielectric material. In further embodiments, at least one of the insulating structures 106 exhibits a substantially heterogeneous distribution of at least one dielectric material. One or more of the insulating structures 106 may, for example, be formed of and include a stack (e.g., laminate) of at least two different dielectric materials. In some embodiments, each of the insulating structures 106 is formed of and includes silicon dioxide (Sift). The insulating structures 106 may each be substantially planar, and may each independently exhibit any desired thickness. In addition, each of the insulating structures 106 may be substantially the same (e.g., exhibit substantially the same material composition, material distribution, size, and shape) as one another, or at least one of the insulating structures 106 may be different (e.g., exhibit one or more of a different material composition, a different material distribution, a different size, and a different shape) than at least one other of the insulating structures 106. In some embodiments, each of the insulating structures 106 is substantially the same as each other of the insulating structures 106.

The additional insulating structures 108 may each be formed of and include at least one additional dielectric material that may be selectively removed relative to the dielectric material of the insulating structures 106. The additional dielectric material of the additional insulating structures 108 may be different than the dielectric material of the insulating structures 106, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). Each of the additional insulating structures 108 may individually include a substantially homogeneous distribution or a substantially heterogeneous distribution of the at least one additional dielectric material. In some embodiments, each of the additional insulating structures 108 exhibits a substantially homogeneous distribution of the additional dielectric material. In further embodiments, at least one of the additional insulating structures 108 exhibits a substantially heterogeneous distribution of at least one dielectric material. One or more of the additional insulating structures 108 may, for example, be formed of and include a stack (e.g., laminate) of at least two different additional dielectric materials. In some embodiments, each of the additional insulating structures 108 is formed of and includes silicon nitride ($Si_3N_4$). The additional insulating structures 108 may each be substantially planar, and may each independently exhibit any desired thickness. In addition, each of the additional insulating structures 108 may be substantially the same (e.g., exhibit substantially the same material composition, material distribution, size, and shape) as one another, or at least one of the additional insulating structures 108 may be different (e.g., exhibit one or more of a different material composition, a different material distribution, a different size, and a different shape) than at least one other of the additional insulating structures 108. In some embodiments, each of the additional insulating structures 108 is substantially the same as each other of the additional insulating structures 108. The additional insulating structures 108 may serve as sacrificial structures for the subsequent formation of conductive structures, as described in further detail below.

With continued reference to FIG. 1B, the microelectronic device structure 100 may further include a source tier 112 (e.g., a source level) vertically under (e.g., in the Z-direction) the preliminary stack structure 102, and at least one control device 114 vertically under (e.g., in the Z-direction) the source tier 112. The source tier 112 may be vertically interposed between (e.g., in the Z-direction) the preliminary stack structure 102 and the control device 114. As shown in FIG. 1B, the source tier 112 may include at least one source structure 116 (e.g., a source plate; at least one source line, such as a common source line (CSL)), and at least one other insulating structure 118 vertically adjacent (e.g., in the Z-direction) the source structure 116. The other insulating structure 118 may vertically intervene (e.g., in the Z-direction) between the source structure 116 and the preliminary stack structure 102.

The source structure 116 of the source tier 112 may be formed of and include at least one conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. The source structure 116 may include a substantially homogeneous distribution of the at least one conductive material, or a substantially heterogeneous distribution of the at least one conductive material. Amounts of the material may vary stepwise (e.g., change abruptly), or may vary continuously (e.g., change progressively, such as linearly, parabolically) throughout different portions of the structure. In some embodiments, the source structure 116 exhibits a substantially homogeneous distribution of conductive material. In additional embodiments, the source structure 116 exhibits a substantially heterogeneous distribution of at least one conductive material. The source structure 116 may, for example, be formed of and include a stack of at least two different conductive materials.

The other insulating structure 118 of the source tier 112 may be formed of and include at least one other dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the other insulating structure 118 may substantially the same as a material composition of the insulating structures 106 or the additional insulating structures 108 of the preliminary stack structure 102, or the material composition of the other insulating structure 118 may be different than the material compositions of the insulating structures 106 and the additional insulating structures 108. In some embodiments, a material composition of the other insulating structure 118 is substantially the same as a material composition of the insulating structures 106 of the preliminary stack structure 102. The other insulating structure 118 may include a substantially homogeneous distribution or a substantially heterogeneous distribution of the at least one other dielectric material thereof. In some embodiments, the other insulating structure 118 exhibits a substantially homogeneous distribution of the other dielectric material. In further embodiments, the other insulating structure 118 exhibits a substantially heterogeneous distribution of at least one dielectric material. In some embodiments, the other insulating structure 118 is formed of and includes Sift.

With continued reference to FIG. 1B, the control device 114 may include devices and circuitry for controlling various operations of other components of the microelectronic device structure 100. By way of non-limiting example, the control device 114 may include one or more (e.g., each) of charge pumps (e.g., $V_{CCP}$ charge pumps, $V_{NEGWL}$ charge pumps, DVC2 charge pumps); delay-locked loop (DLL) circuitry (e.g., ring oscillators); drain supply voltage ($V_{dd}$) regulators; devices and circuitry for controlling column operations for arrays (e.g., arrays of vertical memory strings) to subsequently be formed within the microelectronic device structure 100, such as one or more (e.g., each) of decoders (e.g., column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices; and devices and circuitry for controlling row operations for arrays (e.g., arrays of vertical memory strings) within memory regions of the microelectronic device structure 100, such as one or more (e.g., each) of decoders (e.g., row decoders), drivers (e.g., word line (WL) drivers), repair circuitry (e.g., row repair circuitry), memory test devices, MUX, ECC devices, and self-refresh/wear leveling devices. In some embodiments, the control device 114 includes CMOS (complementary metal-oxide-semiconductor) circuitry. In such embodiments, the control device 114 may be characterized as having a "CMOS under Array" ("CuA") configuration.

As shown in FIG. 1B, each of the first trench regions 122 and the at least one second trench region 124 include designated locations for subsequent locations of trenches that vertically extend (e.g., in the Z-direction) substantially through the preliminary stack structure 102. For example, as shown in FIG. 1B, each of the first trench regions 122 and the second trench region 124 may vertically extend through the tiers 110 (e.g., the first tier 110a, the second tier 110b, the third tier 110c, the fourth tier 110d) of the insulating structures 106 and the additional insulating structures 108, and may terminate at the source structure 116. The first pillar structures 104 may be formed in an array region and may be configured as memory pillar structures (e.g., channel pillar structures) and the second pillar structures 105 may be formed in non-array regions and may be configured as so-called "dummy pillars" that do not operably couple (e.g., electrically connect) with the source structure 116. For example, the second pillar structures 105 in non-array regions provide mechanical integrity and support to the first pillar structures 104 in the array region. The second pillar structures 105 may be formed in openings vertically extending at least partially through the tiers 110. The second pillar structures 105 may be formed in the preliminary stack structure 102 using conventional processes (e.g., conventional deposition processes) and conventional processing equipment, which are not described in detail herein. The second pillar structures 105 of the non-array regions may provide reduced pillar bending to the array region of the microelectronic device structure 100 containing the first pillar structures 104. In other embodiments, at least some of the second pillar structures 105 include memory pillar structures and/or at least some of the first pillar structures 104 include dummy pillars.

The first pillar structures 104 may exhibit a substantially rectangular cross-sectional shape (e.g., a substantially square cross-sectional shape) as shown in the top-down view of FIG. 1A. However, the disclosure is not so limited. As a non-limiting example, in additional embodiments, the first pillar structures 104 exhibit a substantially circular cross-sectional shape. In addition, a pitch between horizontally adjacent first pillar structures 104 may be within a range of from about 50 nm to about 200 nm, such as from about 50 nm to about 100 nm, from about 100 nm to about 150 nm, or from about 150 nm to about 200 nm. In some embodiments, a critical dimension of the individual first pillar structures 104 in a horizontal direction is within a range of from about 20 nm to about 200 nm, such as from about 20 nm to about 50 nm, from about 50 nm to about 100 nm, from about 100 nm to about 150 nm, or from about 150 nm to about 200 nm, for example. One of ordinary skill in the art will appreciate that the pitch between the adjacent first pillar structures 104 and the critical dimension of the individual first pillar structures 104 may be smaller or larger than the stated ranges and may be selected to achieve the desired performance requirements. The second pillar structures 105 may or may not be similarly sized and spaced.

The first pillar structures 104 may be formed in openings vertically extending through the tiers 110. Individual first pillar structures 104 include a channel material of cell film 104a surrounding a fill material 104b. For example, the cell film 104a may include a cell material formed within the openings, and a channel material formed over the cell material. For convenience, the cell material and channel material are illustrated as a single material (e.g., the cell film 104a) in FIG. 1B. However, the cell film 104a is understood to include both the cell material and the channel material. The cell material and channel material are formed by conventional techniques, such as by CVD or ALD. The cell material may, for example, be an oxide-nitride-oxide (ONO) material, such as a silicon oxide-silicon nitride-silicon oxide material, that is conformally formed over sidewalls of the first pillar structures 104. The cell material may be formed at a smaller relative thickness than the channel material. The channel material may be conformally formed over the cell material. The channel material may, for example, be polysilicon. The fill material 104b may be formed over the channel material of the cell films 104a, substantially filling the openings. The fill material 104b may be an insulative material, such as a high quality silicon oxide material. For example, the fill material 104b may be a highly uniform and highly conformal silicon oxide material (e.g., a highly uniform and highly conformal silicon dioxide material). The fill material 104b may be highly uniform and highly conformal as deposited. The fill material 104b may be formed by conventional techniques, such as by ALD. In some embodiments, the fill material 104b is an ALD $SiO_x$. The fill material 104b may initially be formed in the openings and over exposed horizontal surfaces of the tiers 110, with the fill material 104b over the tiers 110 subsequently removed, such as by an abrasive planarization process (e.g., chemical mechanical planarization (CMP)). Accordingly, the fill material 104b is surrounded by the cell material and the channel material of the cell film 104a. At least portions of the cell film 104a and the fill material 104b of the first pillar structures 104 may be operably coupled (e.g., electrically connected) to the source structure 116 underlying the preliminary stack structure 102.

With returned reference to FIG. 1A, in some embodiments, individual blocks of the first pillar structures 104 include an odd number (e.g., 1, 3, 5, 7) of the columns 120. In other embodiments, the individual blocks of the first pillar structures 104 include an even number (e.g., 2, 4, 6, 8) of the columns 120. Neighboring blocks may alternate between an even number and an odd number of the columns 120 in an alternating pattern (e.g., even, odd, even, odd) or, alternatively, in a random (e.g., non-alternating) pattern. For clarity and ease of understanding the drawings and associated description, only six columns 120 of the first pillar structures 104 are illustrated between adjacent portions of the first trench regions 122 in FIG. 1A and FIG. 1B. However, the disclosure is not so limited, and additional columns 120 of the first pillar structures 104 may be included.

Individual first pillar structures 104 of adjacent columns 120 may be staggered, in that the first pillar structures 104 of one of the columns 120 may be horizontally offset (e.g., not aligned in a row direction) from first pillar structures 104 of an immediately adjacent one of the columns 120. The columns 120 may include at least one first column 120a and at least one second column 120b, with the first pillar structures 104 of each of the first column 120a being aligned with one another in the row direction (e.g., the X-direction) and the first pillar structures 104 of each of the second column 120b being aligned with one another in the row direction. In other words, the first pillar structures 104 are staggered, such that the first column 120a of the aligned first pillar structures 104 is offset from the second column 120b of the aligned first pillar structures 104 immediately adjacent to the first column 120a. As shown in FIG. 1A, the first column 120a may be horizontally offset in the Y-direction (e.g., spaced relatively farther from the second trench region 124) than the second column 120b. Accordingly, in embodiments including an even number of the columns 120, each block of the first pillar structures 104 between the first trench regions 122 begins with one of the first column 120a and the second column 120b and ends with the other of the first column 120a and the second column 120b. In other words, where the first column 120a immediately adjacent to one of the first trench regions 122 is horizontally offset (e.g., down) in the Y-direction relative to the second column 120b, then the last second column 120b immediately adjacent a second one of the first trench regions 122 is horizontally offset (e.g., up) in the Y-direction relative to the first column 120a.

In some embodiments, the pattern of the first column 120a and the second column 120b of the columns 120 exhibits a so-called "mirror" pattern that is symmetric with respect to individual first trench regions 122. In other embodiments, the pattern of the first column 120a and the second column 120b of the columns 120 exhibits a so-called "step" pattern that is asymmetric with respect to individual first trench regions 122. Put another way, one of the first trench regions 122 may be adjacent (e.g., may be flanked by) two of the first columns 120a (or two second columns 120b) to form a mirror pattern or, alternatively, one of the first trench regions 122 may be adjacent (e.g., may be flanked by) one of the first columns 120a and one of the second columns 120b to form a step pattern. As discussed above, at least some (e.g., each) of the individual blocks of the first pillar structures 104 may include an odd number of the columns 120 or, alternatively, an even number of the columns 120. Neighboring blocks may alternate between the even number and the odd number of the columns 120. Accordingly, the pattern of the first column 120a and the second column 120b of the columns 120 relative to the first trench regions 122 and the second trench region 124 may vary within the array region.

Figure 2A:
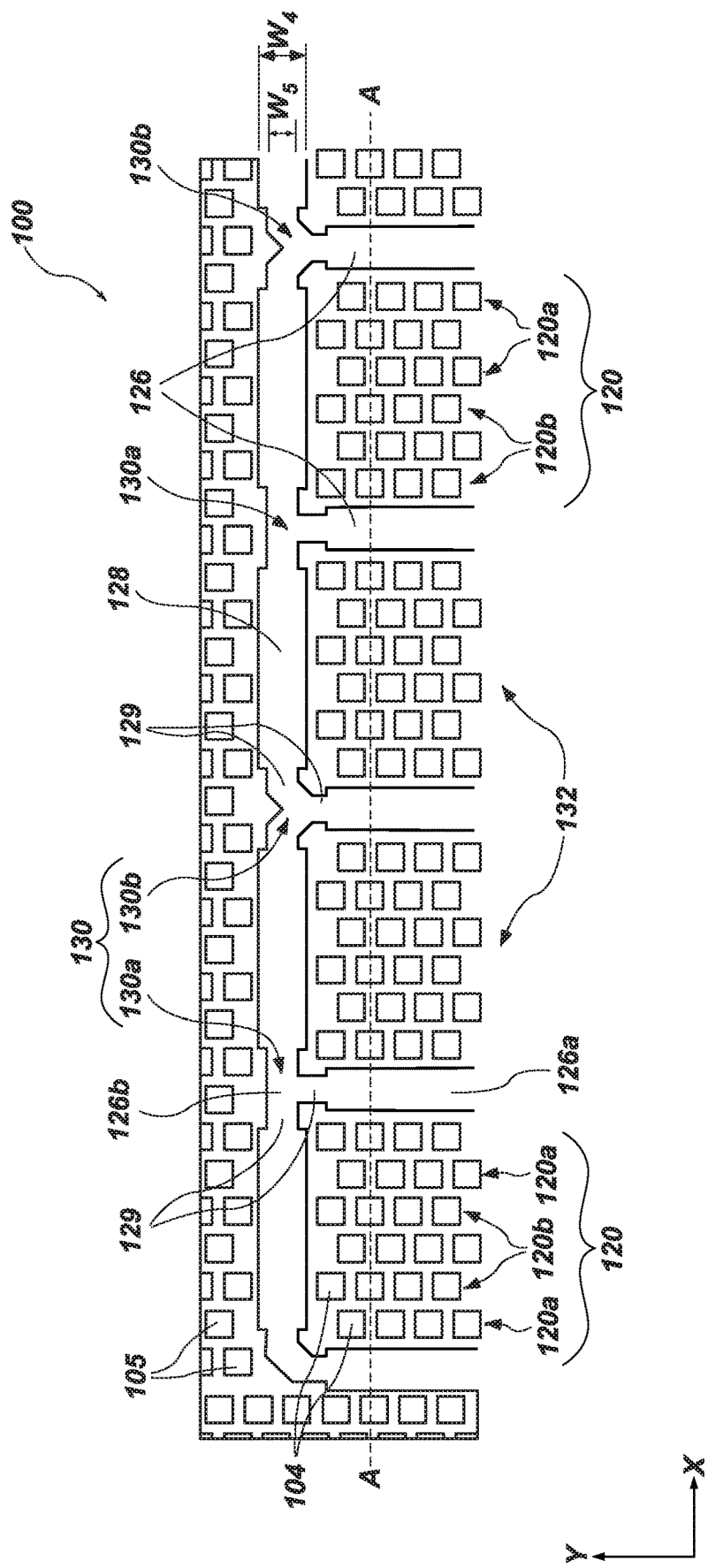
Figure 2B:
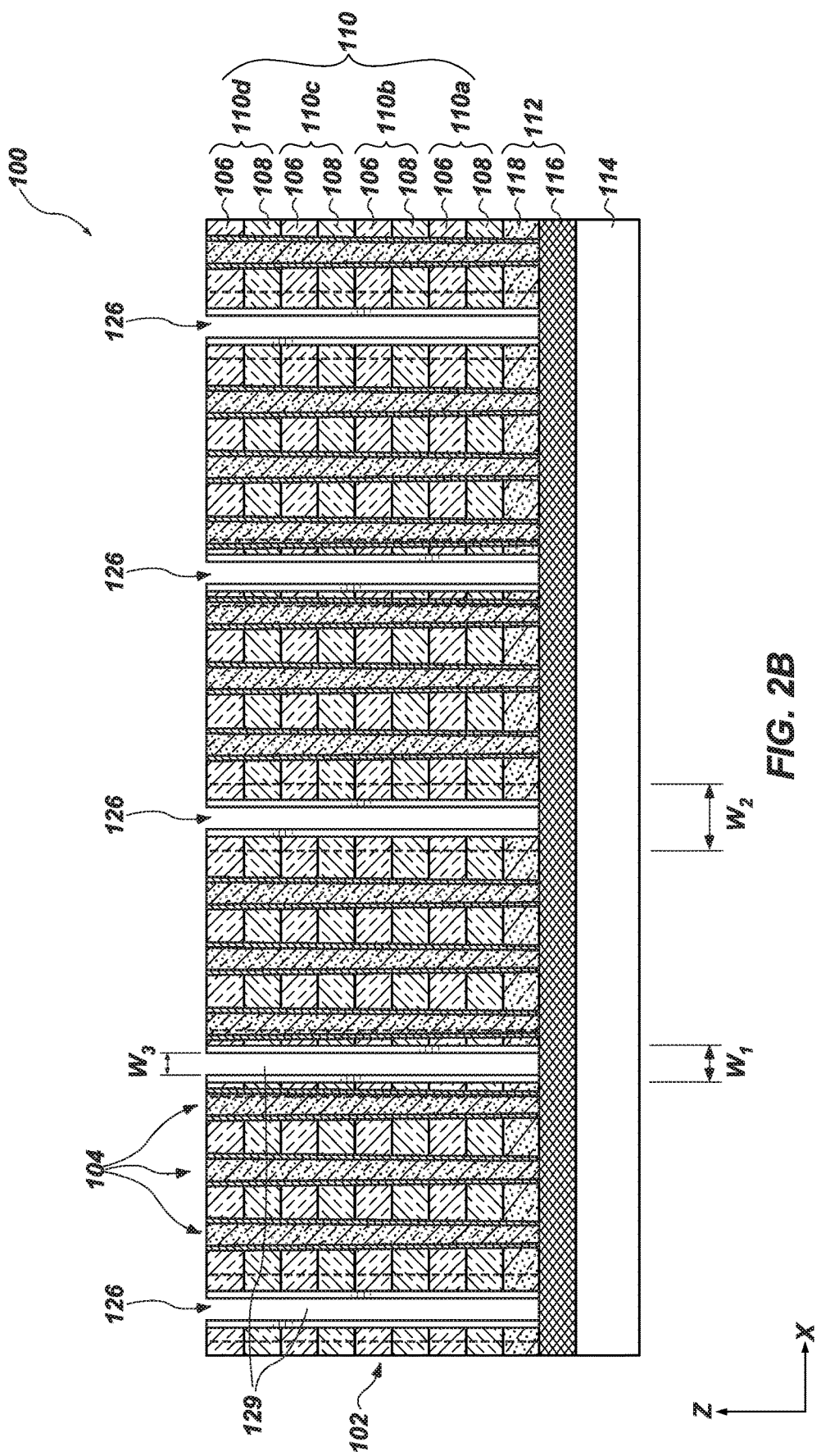

Referring next to FIG. 2A, first trenches 126 (e.g., slots, openings) and at least one second trench 128 (e.g., at least one additional slot, at least one additional opening) may be formed to vertically extend into the preliminary stack structure 102. The second trench 128 extends in the first horizontal direction (e.g., the X-direction) and each of the first trenches 126 extends in the second horizontal direction (e.g., the Y-direction) transverse to the first horizontal direction. The first trenches 126 intersect the second trench 128 at intersections 130. FIG. 2B is a simplified partial cross-sectional view of the microelectronic device structure 100 (about the line A-A) at the processing stage shown in FIG. 2A. For clarity and ease of understanding of the drawings and related description, not all features depicted in one of FIGS. 2A and 2B are depicted in the other of FIGS. 2A and 2B.

As shown in FIG. 2A, the first trenches 126 may be formed within the first trench regions 122 (FIG. 1A) and the second trench 128 may be formed within the at least one second trench region 124 (FIG. 1A). The first trenches 126 and the second trench 128 may each be formed to vertically extend substantially completely through the preliminary stack structure 102. As shown in FIG. 2B, each of the first trenches 126 may vertically extend (e.g., in the Z-direction) from a vertically uppermost boundary of a vertically uppermost tier 110 (e.g., the fourth tier 110d) of the preliminary stack structure 102 to a vertically lowermost boundary of a vertically lowermost tier 110 (e.g., the first tier 110a) of the preliminary stack structure 102. In addition, the second trench 128 may vertically extend completely through the tiers 110 of the preliminary stack structure 102.

Each of the first trenches 126 may include a relatively narrower portion 126a, and a relatively wider portion 126b disposed at a horizontal end (e.g., in the Y-direction) of the relatively narrower portion 126a. As shown in FIG. 2B, the relatively narrower portion 126a of each of the first trenches 126 may have a first width $W_1$ (e.g., a first horizontal dimension in the X-direction), and the relatively wider portion 126b of each of the first trenches 126 may have a second width $W_2$ (e.g., a second horizontal dimension in the X-direction) larger than the first width $W_1$ of the relatively narrower portion 126a. The second width $W_2$ may, for example, be within a range of from about 1 percent to about 500 percent (e.g., from about 10 percent to about 250 percent, from about 25 percent to about 125 percent, from about 50 percent to about 100 percent) larger than the first width $W_1$.

In addition, the relatively narrower portion 126a of each of the first trenches 126 may exhibit a different shape than the relatively wider portion 126b of each of the first trenches 126. For example, the relatively narrower portion 126a of each first trench 126 may exhibit a rectangular prism shape having a substantially rectangular horizontal cross-sectional shape extending in the second horizontal direction. In some embodiments, the relatively wider portion 126b of at least some of first trenches 126 exhibits a triangular shape (e.g., a right triangular shape) having a substantially triangular horizontal cross-sectional shape having one or more (e.g., two) sides having an acute angle relative to each of the first horizontal direction and the second horizontal direction. In some embodiments, the triangular shape exhibits a "V" shape. By way of example and not limitation, angled sides of the relatively wider portions 126b may be aligned at an angle of within a range from about 35 degrees to about 55 degrees, such as about 45 degrees, from the first horizontal direction and at a complementary angle from the second horizontal direction. Accordingly, a combination of the relatively narrower portions 126a and the relatively wider portions 126b of the first trenches 126 may exhibit a "Y" shape, forming a so-called "Y-shaped" intersection within at least some of the intersections 130. In additional embodiments, the relatively wider portion 126b of at least some of first trenches 126 may exhibit a rectangular prism shape having another substantially rectangular horizontal cross-sectional shape extending in the first horizontal direction. Accordingly, a combination of the relatively narrower portions 126a and the relatively wider portions 126b of the first trenches 126 may exhibit a "T" shape, forming a so-called "T-shaped" intersection within at least some of the intersections 130.

The second width $W_2$ and the shape of the relatively wider portion 126b of each of the first trenches 126 may be selected to inhibit (e.g., prevent) undesirable tier deformations (e.g., tier warping) and/or tier collapse. For example, the second width $W_2$ and the shape of the relatively wider portion 126b of the first trenches 126 may prevent the risk of undesirable current leakage and short circuits. The configuration of the Y-shaped intersection may provide increased structural support at horizontally proximate locations corresponding to horizontal ends (e.g., horizontal boundaries in the Y-direction) of the relatively narrower portions 126a of the first trenches 126 without undesirably increasing the overall width (e.g., horizontal footprint) of the intersections 130. The Y-shaped intersection may also decrease the acceptable margin of error associated with different acts in the process of forming the first trenches 126 and the second trench 128 adjacent to the first pillar structures 104. Accordingly, providing the Y-shaped intersection within at least some of the intersections 130 may result in better process margins for closer proximity of the first pillar structures 104 to the first trenches 126 and the second trench 128 and provide increased structural support, once filed with a material, compared to only providing T-shaped intersections.

At least some of the first trenches 126 may, optionally, include a reduced portion 129 having a third width $W_3$ located between the relatively narrower portion 126a and the relatively wider portion 126b. As shown in FIG. 2B, in some embodiments, the third width $W_3$ of the reduced portion 129 is less than each of the first width $W_1$ of the relatively narrower portions 126a and the second width $W_2$ of the relatively wider portions 126b of the first trenches 126, such that the first trenches 126 include the reduced portion 129 having a reduced cross-sectional area proximate the intersections 130 during formation of the first trenches 126. A transition between the relatively narrower portions 126a and the reduced portion 129 may or may not exhibit an abrupt topographical change (e.g., a lip), as shown in FIG. 2A. In some embodiments, the transition between the relatively narrower portions 126a and the reduced portion 129 exhibits a gradual (e.g., tapered) transition. In some instances, the proximity of the first trenches 126 to the second trench 128 near the intersections 130 may result in so-called "overetch" during processing. For example, if the regions of the first trenches 126 having the reduced portion 129 were to be formed at the first width $W_1$, then overetch of the tier materials of the tiers 110 may occur proximate the intersections 130 during formation of the first trenches 126 and the second trench 128. In some instances, damage may occur at the intersections 130 during fabrication. Particularly, damage on the corners of the tiers 110, also called "clipping," may be a source of defect, which can adversely affect memory device performance. Accordingly, at least some of the first trenches 126 may, optionally, include the reduced portion 129 during formation in order to substantially reduce (e.g., substantially prevent) overetch of the tier materials of the tiers 110 at the intersections 130.

Referring to FIG. 2A in combination with FIG. 2B, the second trench 128 may exhibit a fourth width $W_4$ (e.g., a horizontal dimension in the Y-direction). The fourth width $W_4$ may be substantially the same as (e.g., substantially equal to) the first width $W_1$ of the relatively wider portion 126b of the first trenches 126, or the fourth width $W_4$ may be different than (e.g., not equal to) the first width $W_1$. The second trench 128 may, optionally, include the reduced portion 129 having a fifth width $W_5$ proximate the intersections 130. The fifth width $W_5$ of the reduced portion 129 of the second trench 128 and the third width $W_3$ of the reduced portion 129 of the first trenches 126 may each individually be less than each of the first width $W_1$ and the second width $W_2$ of each of the relatively narrower portions 126a and the relatively wider portions 126b of the first trenches 126 and less than the fourth width $W_4$ of the second trench 128.

By way of non-limiting example, each of the first width $W_1$ of the first trenches 126 and the fourth width $W_4$ of the second trench 128 may be within a range from about 100 nm to about 400 nm, such as within a range from about 100 nm to about 200 nm, within a range from about 200 nm to about 300 nm, or within a range from about 300 nm to about 400 nm. Each of the third width $W_3$ and the fifth width $W_5$ may, for example, be within a range of from about 1 percent to about 50 percent (e.g., from about 1 percent to about 10 percent, from about 10 percent to about 25 percent, from about 25 percent to about 50 percent) less than each of the first width $W_1$ and the fourth width $W_4$.

With returned reference to FIG. 2A, the first trenches 126 and the second trench 128 may divide the preliminary stack structure 102 into an array of blocks 132. The blocks 132 of the array may each extend in substantially the same horizontal direction (e.g., the Y-direction) as one another, and neighboring blocks 132 of the array may be horizontally separated (e.g., in the X-direction) from one another by the first trenches 126. Each of the blocks 132 of the array may exhibit substantially the same geometric configuration (e.g., dimensions, shape) as each other of the blocks 132 the array. In addition, each pair of laterally-neighboring blocks 132 of the array may be horizontally separated from one another by substantially the same distance (e.g., corresponding to the first width $W_1$ of the first trenches 126) as each other pair of laterally-neighboring blocks 132 of the array. Accordingly, the blocks 132 of the array may be substantially uniformly (e.g., non-variably, equally, consistently) sized, shaped, and spaced relative to one another.

The intersections 130 may be defined as the point at which the second trench 128 extending in the first horizontal direction and the first trenches 126 extending in the second horizontal direction, transverse to the first horizontal direction meet. By way of non-limiting example, each of the first trenches 126 and the second trench 128 may exhibit differing shapes within the intersections 130, such as an "L" shape, a "T" shape, or a "Y" shape. Accordingly, the intersections 130 may be referred to as an L-shaped intersection, a T-shaped intersection, or a Y-shaped intersection, respectively. Since the blocks 132 of the first pillar structures 104 may include an odd number of the columns 120 or an even number of the columns 120, as well as an alternating pattern of the odd number and the even number of the columns 120 among the neighboring blocks 132, the intersections 130 may be different from one another throughout the array. For example, at a longitudinal end of the array, a first one of the first trenches 126 may intersect an end point (e.g., a terminus) of the second trench 128 and may include an inverted L-shaped intersection 130 or, alternatively, one-half of a Y-shaped intersection 130, as shown in FIG. 2A. Other of the intersections 130 may include, for example, T-shaped intersections 130a and Y-shaped intersections 130b of the intersections 130. For example, in embodiments including an even number of the columns 120 beginning with the first column 120a, for example, and ending with the second column 120b in each of the blocks 132, the T-shaped intersection 130a and the Y-shaped intersection 130b may be located in an alternating pattern relative to one another in order to facilitate placement of the mirror pattern and/or the step pattern of the alternating pattern of the first column 120a and the second column 120b of the even-numbered columns 120. Put another way, the T-shaped intersections 130a horizontally alternate (e.g., in the X-direction) with the Y-shaped intersection 130b, in some embodiments. One of the Y-shaped intersections 130b may be located between two of the first columns 120a that are horizontally offset (e.g., down) in the Y-direction relative to the second columns 120b in a mirror pattern, and one of the T-shaped intersections 130a may be located between two of the second columns 120b that are horizontally offset (e.g., up) in the Y-direction relative to the first columns 120a in another mirror pattern. Alternating the Y-shaped intersections 130b with the T-shaped intersections 130a may provide increased flexibility by providing the option to include either mirror patterns or step patterns within the blocks 132, particularly when there are an even number of the columns 120 within the blocks 132 of the array region. In other embodiments, two (2) or more of the T-shaped intersection 130a and/or the Y-shaped intersection 130b are horizontally adjacent, such as when the blocks 132 include the alternating pattern of the odd number and the even number of the columns 120.

The first trenches 126 and the second trench 128 may be formed in the preliminary stack structure 102 using conventional material removal (e.g., masking and etching) processes, which are not described in detail herein. For example, one or more portions of the preliminary stack structure 102 may be subjected to at least one etching process (e.g., at least one dry etching process, such as one or more of a reactive ion etching (RIE) process, a deep RIE process, a plasma etching process, a reactive ion beam etching process, and a chemically assisted ion beam etching process; at least one wet etching process, such as one or more of a hydrofluoric acid etching process, a buffered hydrofluoric acid etching process, and a buffered oxide etching process) to form the first trenches 126 and the second trench 128 in the preliminary stack structure 102.

Figure 3A:
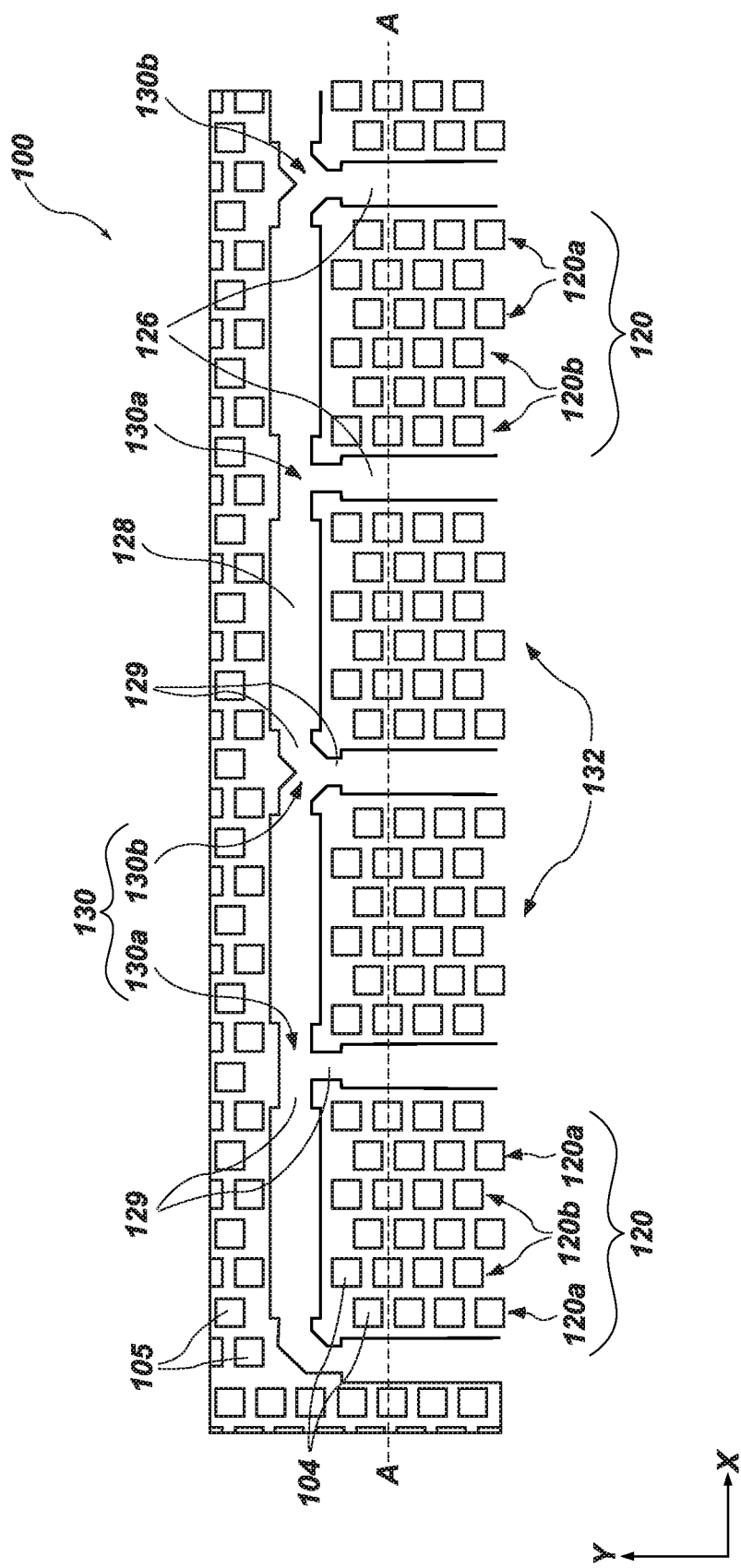
Figure 3B:
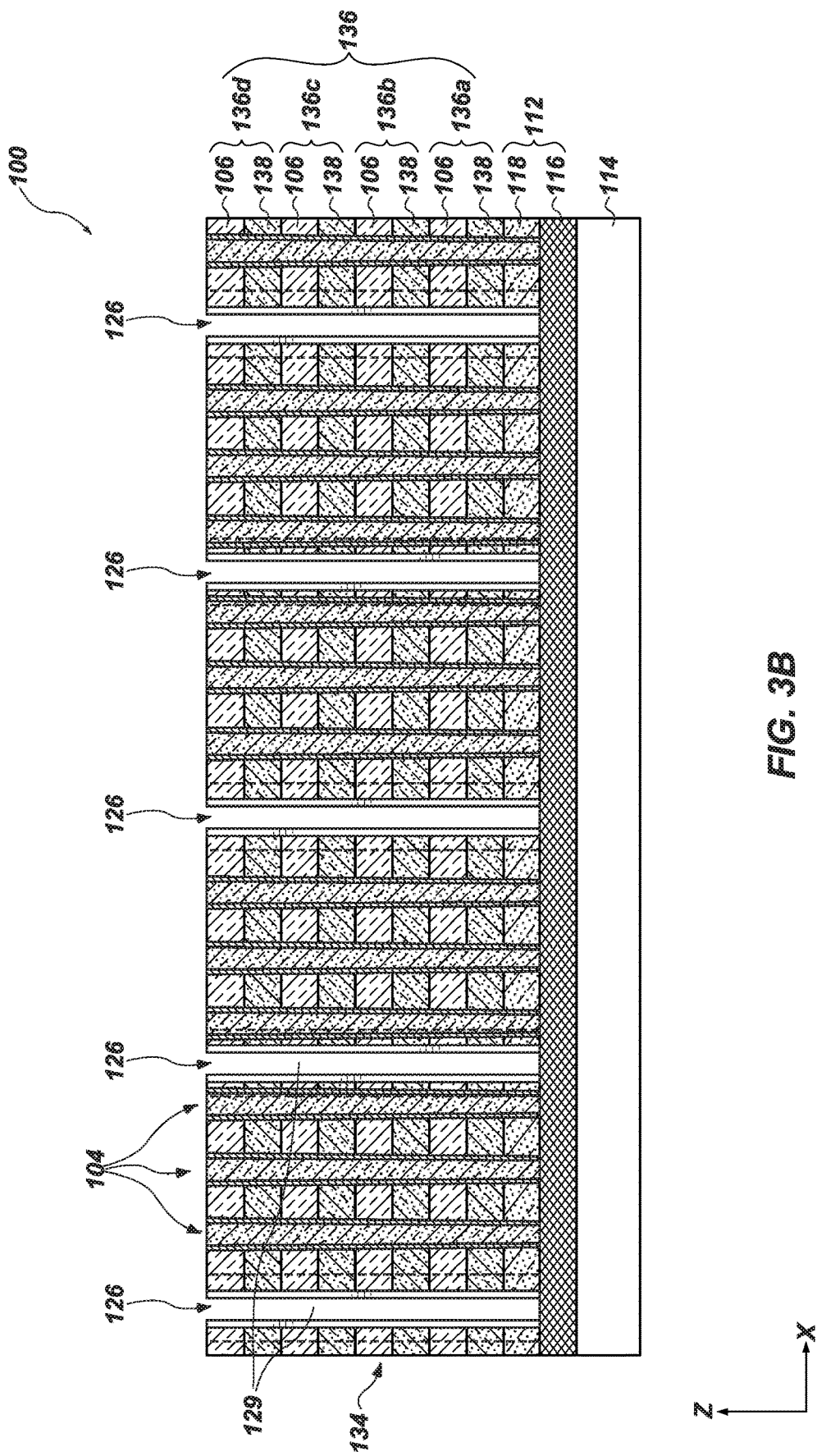
Figure 4A:
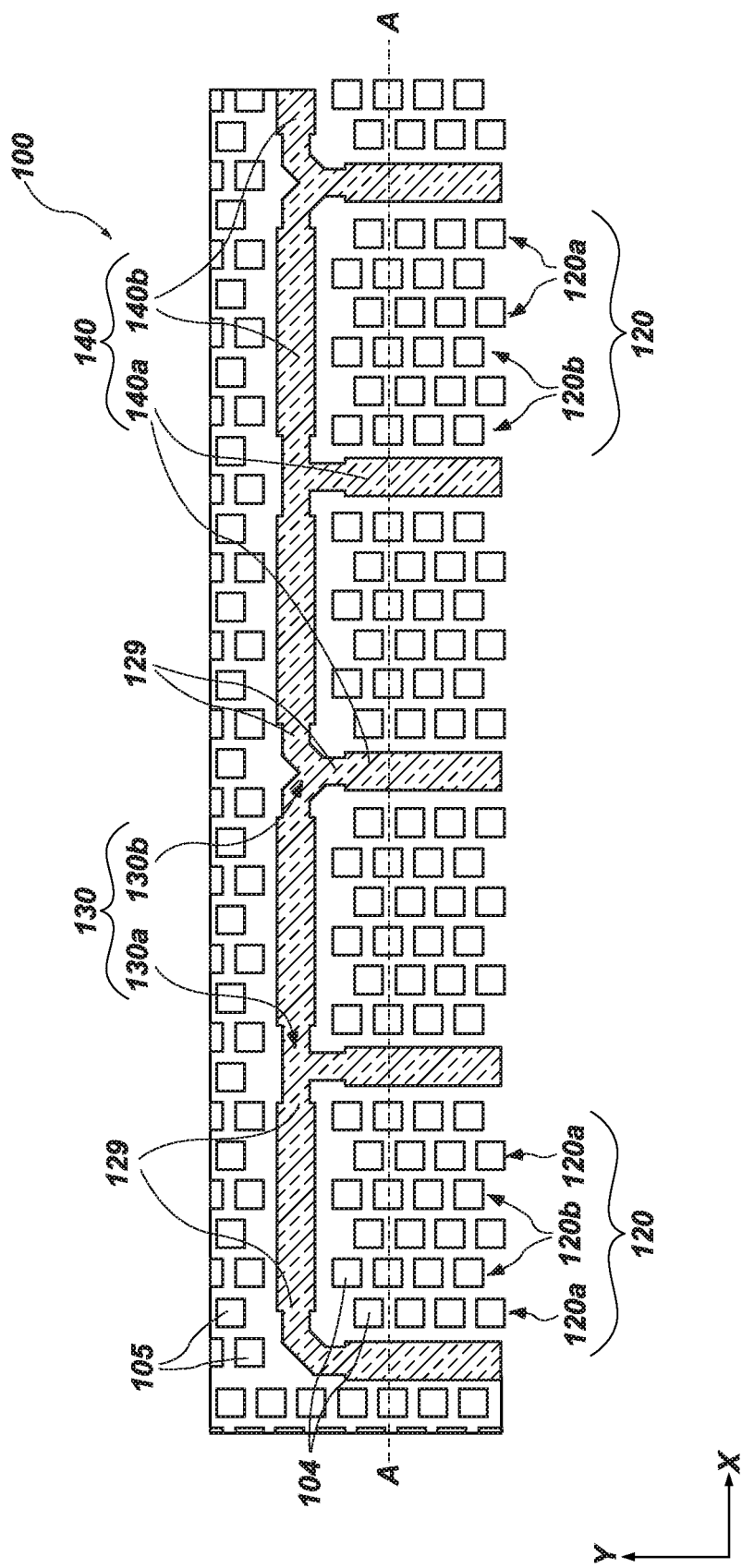
Figure 4B:
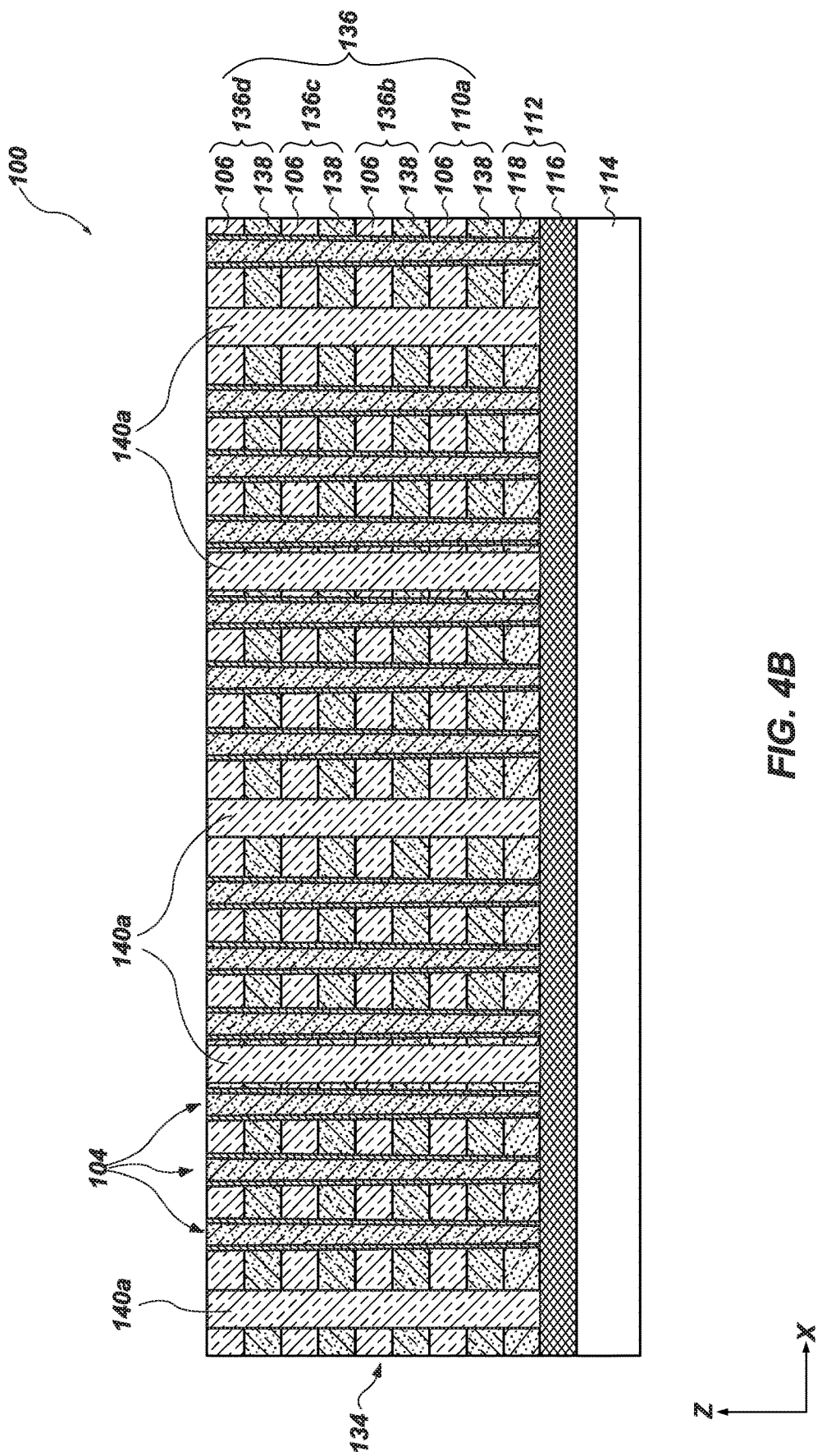

Referring next to FIG. 3A, the microelectronic device structure 100 at the processing stage depicted in FIGS. 2A and 2B may be subjected to a "replace gate" or "gate last" process to convert the preliminary stack structure 102 (FIGS. 2A and 2B) into a conductive stack structure 134 (FIG. 3B), and then first trenches 126 and the at least one second trench 128 may be a least partially (e.g., substantially completely) filled with at least one dielectric structure, as discussed in greater detail with reference to FIGS. 4A and 4B. FIG. 3B is a simplified partial cross-sectional view of the microelectronic device structure 100 (about the line A-A) at the processing stage shown in FIG. 3A. For clarity and ease of understanding of the drawings and related description, not all features depicted in one of FIGS. 3A and 3B are depicted in the other of FIGS. 3A and 3B.

Referring to FIG. 3B, the replace gate process may include selectively removing one or more portions of the additional insulating structures 108 (FIG. 2B) of the tiers 110 (FIG. 2B) of the preliminary stack structure 102 (FIG. 2B) exposed by the first trenches 126 and the second trench 128, and then filling spaces previously occupied by the additional insulating structures 108 with at least one conductive material to form conductive structures 138. During the formation of the conductive structures 138, the configuration of the Y-shaped intersections may inhibit (e.g., prevent) the undesirable tier deformations (e.g., tier warping) and/or tier collapse during the formation of the conductive tiers 136 by reducing an offset margin of the first pillar structures 104 to the first trenches 126 and the second trench 128, such as to mitigate the risk of undesirable current leakage and short circuits by providing increased structural support during use and operation of a microelectronic device (e.g., a memory device, such as a 3D NAND Flash memory device) including the microelectronic device structure 100. As shown in FIG. 3B, the conductive stack structure 134 may be formed to include a vertically alternating (e.g., in the Z-direction) sequence of the insulating structures 106 and the conductive structures 138 arranged in conductive tiers 136. A quantity of the conductive tiers 136 in the conductive stack structure 134 may correspond to (e.g., be the same as) the quantity of the tiers 110 (FIG. 2B) included in the preliminary stack structure 102 (FIG. 2B). Each of the conductive tiers 136 of the conductive stack structure 134 may include an insulating structure 106 and a conductive structure 138 vertically adjacent the insulating structure 106.

With returned reference to FIG. 3B, the conductive structures 138 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the conductive structures 138 are formed of and include W. Each of the conductive structures 138 may individually include a substantially homogeneous distribution of the at least one conductive material, or a substantially heterogeneous distribution of the at least one conductive material. In some embodiments, each of the conductive structures 138 exhibits a substantially homogeneous distribution of conductive material. In additional embodiments, at least one of the conductive structures 138 exhibits a substantially heterogeneous distribution of at least one conductive material.

The conductive structures 138 of one or more vertically upper conductive tiers 136 (e.g., a fourth conductive tier 136d, a third conductive tier 136c) of the conductive stack structure 134 may be employed as select gate structures (e.g., drain side select gate (SGD) structures) for the blocks 132 of the array. In addition, the conductive structures 138 of one or more vertically lower conductive tiers 136 (e.g., a first conductive tier 136a) of the conductive stack structure 134 may be employed as additional select gate structures (e.g., source side select gate (SGS) structures) for the blocks 132 of the array. The conductive structures 138 of one or more remaining conductive tiers 136 (e.g., a second conductive tier 136b) of the conductive stack structure 134 may be employed as access line (e.g., word line) structures (e.g., access line plates, word line plates) for the blocks 132 of the array.

The additional insulating structures 108 (FIG. 2B) of the tiers 110 (FIG. 2B) of the preliminary stack structure 102 (FIG. 2B) may be selectively removed by subjecting the preliminary stack structure 102 to at least one etching process (e.g., an isotropic etching process) employing an etch chemistry in which the additional dielectric material of the additional insulating structures 108 (FIG. 2B) is selectively removed relative to the dielectric material of the insulating structures 106. By way of non-limiting example, if the insulating structures 106 are formed of and include Sift, and the additional insulating structures 108 are formed of and include $Si_3N_4$, the preliminary stack structure 102 may be exposed to an etchant comprising phosphoric acid ($H_3PO_4$) to selectively remove one or more portions of the additional insulating structures 108 adjacent side surfaces the blocks 132 of the array exposed by the first trenches 126 and the second trench 128. Thereafter, the conductive material may be formed (e.g., delivered, deposited) within void spaces resulting from the selective removal of the additional dielectric material of the additional insulating structures 108 (FIG. 2B) to form the conductive structures 138.

Referring next to FIG. 4A, dielectric structures 140 may be formed within the first trenches 126 and the at least one second trench 128. The dielectric structures 140 may at least partially fill the first trenches 126, including the relatively narrower portions 126a (FIG. 2A) and the relatively wider portions 126b (FIG. 2A), as well as the optional reduced portion 129, if present. FIG. 4B is a simplified partial cross-sectional view of the microelectronic device structure 100 (about the line A-A) at the processing stage shown in FIG. 4A. For clarity and ease of understanding of the drawings and related description, not all features depicted in one of FIGS. 4A and 4B are depicted in the other of FIGS. 4A and 4B.

The dielectric structures 140 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the dielectric structures 140 may substantially the same as a material composition of the insulating structures 106 of the conductive stack structure 134, or the material composition of the dielectric structures 140 may be different than the material composition of the insulating structures 106. The dielectric structures 140 may include a substantially homogeneous distribution or a substantially heterogeneous distribution of the at least one dielectric material thereof. In some embodiments, each of the dielectric structures 140 exhibits a substantially homogeneous distribution of the dielectric material thereof. In further embodiments, one or more of the dielectric structures 140 exhibits a substantially heterogeneous distribution of dielectric material thereof. In some embodiments, the dielectric structures 140 are formed of and include $SiO_2$.

With returned reference to FIG. 4A, the dielectric structure 140 may include first portions 140a at least partially (e.g., substantially completely) filling the first trenches 126 (FIG. 2A), and second portions 140b at least partially (e.g., substantially completely) filling the second trench 128 (FIG. 2A), as well as the optional reduced portion 129, if present. The first portions 140a of the dielectric structure 140 may extend in the second horizontal direction (e.g., the Y-direction), and the second portions 140b of the dielectric structure 140 may intersect the first portions 140a of the dielectric structure 140 at the intersections 130 and may extend in the first horizontal direction (e.g., the X-direction) orthogonal to the second horizontal direction. The first portions 140a of the dielectric structure 140 may horizontally intervene (e.g., in the X-direction) between the laterally-neighboring blocks 132 of the first pillar structures 104. The second portions 140b of the dielectric structure 140 may be integral and continuous with ends (e.g., in the Y-direction) of the first portions 140a of the dielectric structure 140, and may extend (e.g., in the X-direction) from and between the first portions 140a of the dielectric structure 140. According, the first portions 140a and the second portions 140b of the dielectric structure 140 at least partially (e.g., substantially completely) fill the intersections 130 (e.g., the T-shaped intersection 130a, the Y-shaped intersection 130b). In some embodiments, a minimum distance between the first pillar structures 104 and the dielectric structure 140 is within a range of from about 50 nm to about 200 nm, such as from about 50 nm to about 100 nm, from about 100 nm to about 150 nm, or from about 150 nm to about 200 nm.

As shown in FIG. 4B, each of the first portions 140a of the dielectric structure 140 may vertically extend (e.g., in the Z-direction) from a vertically uppermost boundary of a vertically uppermost conductive tier 136 (e.g., the fourth conductive tier 136d) of the conductive stack structure 134 to a vertically lowermost boundary of a vertically lowermost conductive tier 136 (e.g., the first conductive tier 136a) of the conductive stack structure 134. In addition, referring again to FIG. 4A, the second portions 140b of the dielectric structure 140 may vertically extend completely through the conductive tiers 136 of the conductive stack structure 134.

The dielectric structures 140 may be formed using conventional processes (e.g., conventional deposition processes) and conventional processing equipment, which are not described in detail herein. For example, the first portions 140a of the dielectric structures 140 may be formed within the first trenches 126 (FIG. 2A) and the second portions 140b thereof may be formed within the second trench 128 (FIG. 2A) using one or more conventional material deposition processes (e.g., a conventional CVD process, a conventional ALD process).

FIGS. 5A through 5D are excerpts from FIG. 4A illustrating enlarged views of various embodiments of the Y-shaped intersection 130b of the intersections 130 (FIG. 4A). The Y-shaped intersections 130b of the various embodiments of FIGS. 5A through 5D may or may not include the dielectric structure 140 (e.g., the first portions 140a, the second portions 140b) located within the optional reduced portion 129 of the first trenches 126 (FIG. 2A) and the second trench 128 (FIG. 2A). For clarity and ease of understanding of the drawings and related description, the Y-shaped intersection 130b of the various embodiments of FIGS. 5A through 5D include the reduced portion 129. However, the reduced portion 129 may not be present once the first trenches 126 and the second trench 128 are filled with the dielectric structure 140. The dielectric structure 140 within the Y-shaped intersection 130b may include one or more (e.g., two opposing) angled portions 141 of the dielectric structure 140 that may be aligned at an angle of within a range from about 35 degrees to about 55 degrees, such as about 45 degrees, from the first horizontal direction and at a complementary angle from the second horizontal direction. An upper portion disposed at a horizontal end (e.g., in the Y-direction) of the Y-shaped intersection 130b may exhibit a triangular shape (e.g., a right triangular shape) having a substantially triangular horizontal cross-sectional shape of the dielectric structure 140. In some embodiments, the triangular shape of the "Y" shape of the Y-shaped intersection 130b is a solid region defined by three (3) substantially linear portions that is devoid notches and/or indentations. In other embodiments, the triangular shape exhibits a "V" shape having one or more notches and/or indentations in the upper portion of the Y-shaped intersection 130b, as shown in FIGS. 5A through 5D.

Figure 5A:
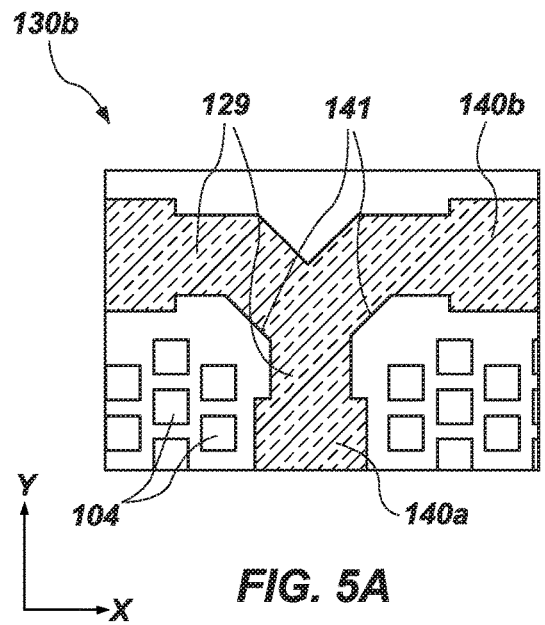
FIGS. 5A through 5D are simplified partial top-down views illustrating excerpts from FIG. 4A, in accordance with embodiments of the disclosure.
Figure 5B:
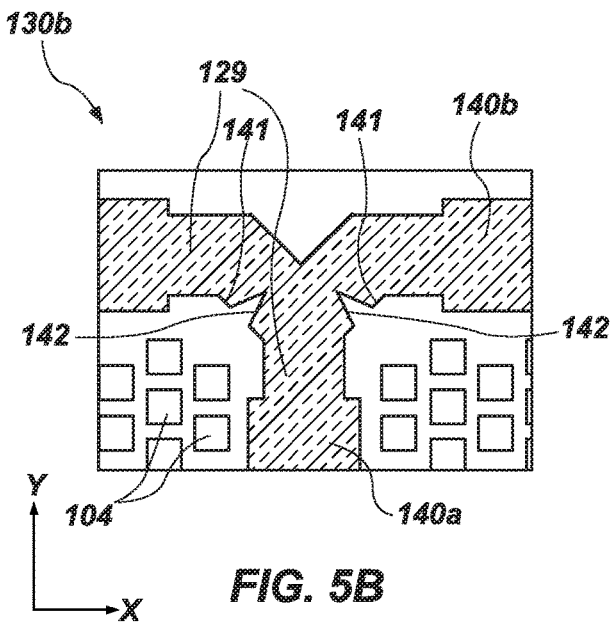
Figure 5C:
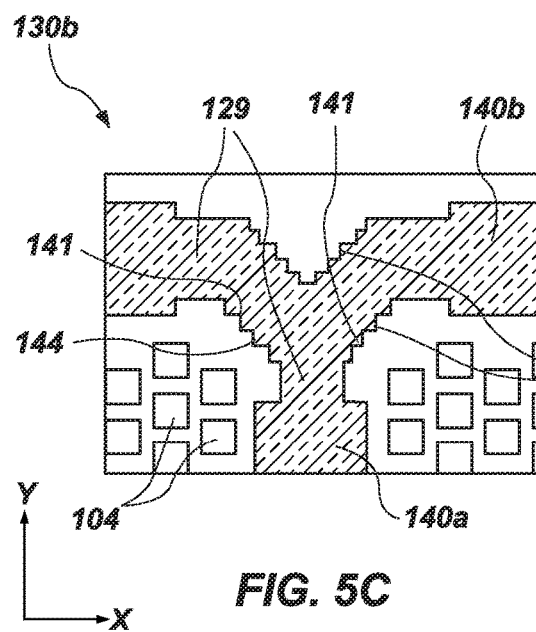
Figure 5D:
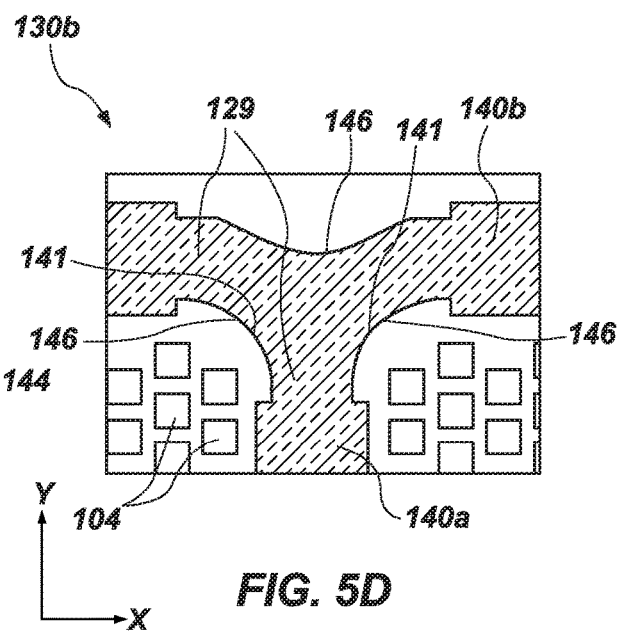

As shown in the embodiment of FIG. 5A, each of the angled portions 141 of the dielectric structure 140 may include a single substantially linear portion that is uninterrupted (e.g., extending along a substantially straight line) between the first portions 140a and the second portions 140b of the dielectric structure 140. As shown in the embodiment of FIG. 5B, each of the angled portions 141 of the dielectric structure 140 may include the single substantially linear portion, similar to that of the embodiment of FIG. 5A. However, in the embodiment of FIG. 5B, the single substantially linear portion may be interrupted by a notch 142 (e.g., a single notch) within each of the angled portions 141. The notch 142 may facilitate closer proximity of the dielectric structure 140 within the intersections 130 to immediately-adjacent first pillar structures 104. In additional embodiments, the angled portions 141 may include a stepped region 144 without including the single substantially linear portion in each of the angled portions 141, as shown in the embodiment of FIG. 5C. In yet other embodiments, the angled portions 141 include an arc region 146 (e.g., a portion of a substantially circular cross-sectional shape, a portion of a substantially elliptic cross-sectional shape) within each of the angled portions 141 of the dielectric structure 140. As shown in FIG. 5D, the arc region 146 may also be formed in the upper portion of the Y-shaped intersection 130b. Accordingly, the configuration of the Y-shaped intersection 130b may be selected to inhibit (e.g., prevent) the undesirable tier deformations (e.g., tier warping) and/or tier collapse during the formation of the conductive tiers 136 by facilitating closer proximity (e.g., reduced pillar offset) of the immediately-adjacent first pillar structures 104 to either side of the dielectric structure 140 proximate the intersections 130 without increasing a cross-sectional area of the intersections 130.

Thus, in accordance with embodiments of the disclosure, a method of forming a microelectronic device comprises forming a stack structure comprising vertically alternating insulating structures and additional insulating structures arranged in tiers. Each of the tiers individually comprises one of the insulating structures and one of the additional insulating structures. Pillar structures are formed to vertically extend through the stack structure. The method comprises forming at least one trench substantially vertically extending through the stack structure and horizontally extending in a first direction, and forming additional trenches substantially vertically extending through the stack structure and horizontally extending in a second direction transverse to the first direction. Each of the additional trenches comprises a first portion having a first width, and a second portion at a horizontal boundary of the first portion and having a second width greater than the first width. A dielectric structure is formed within the at least one trench and the additional trenches. The dielectric structure comprises at least one angled portion proximate the horizontal boundary of the first portion of at least some of the additional trenches. The at least one angled portion extends at an acute angle to each of the first direction and the second direction.

Microelectronic device structures (e.g., the microelectronic device structure 100 previously described with reference to FIGS. 4A and 4B) in accordance with embodiments of the disclosure may be included in embodiments of microelectronic devices of the disclosure. For example, FIG. 6 illustrates a partial cutaway perspective view of a portion of a microelectronic device 600 (e.g., a memory device, such as a 3D NAND Flash memory device), in accordance with embodiments of the disclosure.

Figure 6:
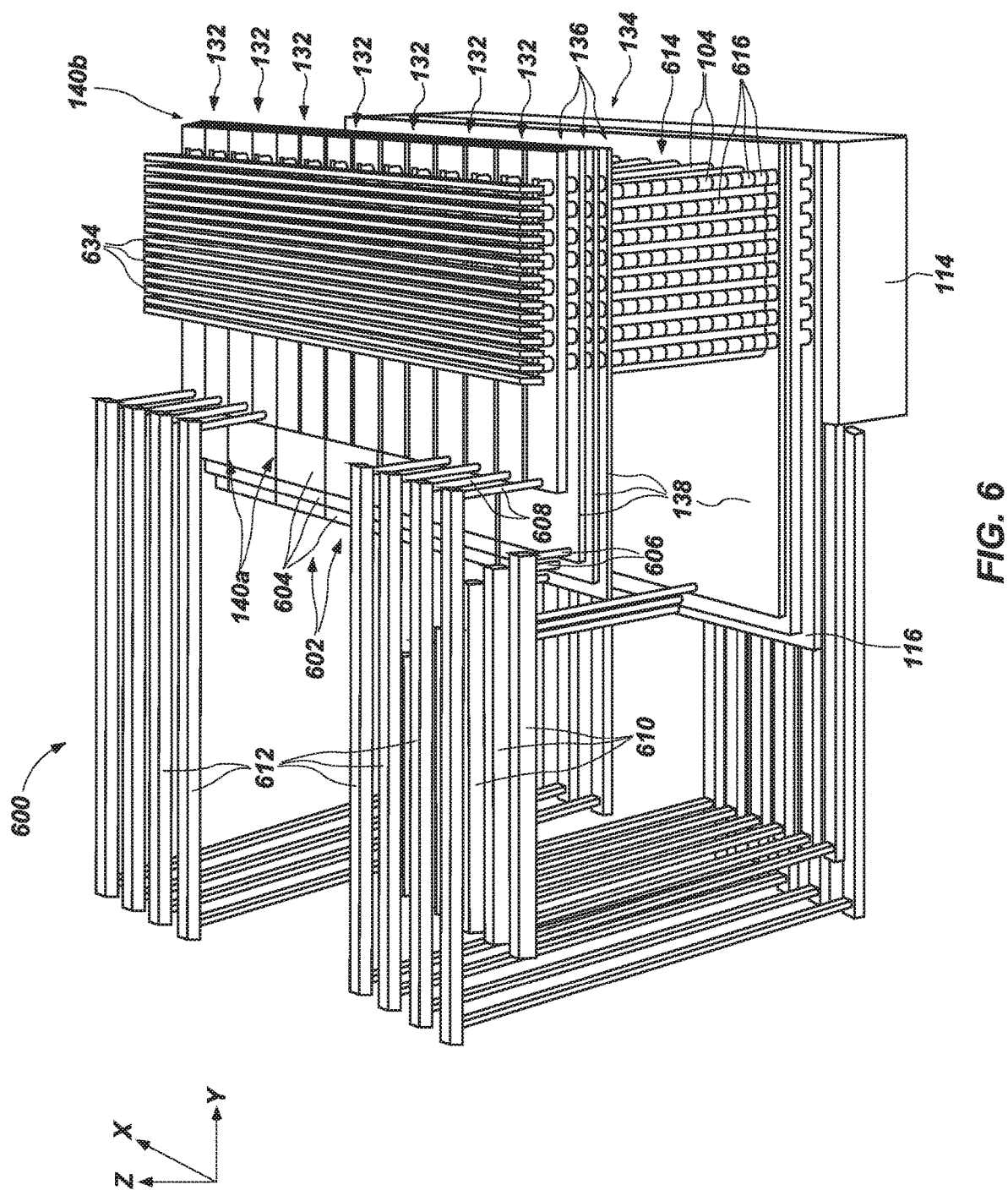
FIG. 6 is a partial cutaway perspective view of a microelectronic device, in accordance with an embodiment of the disclosure.

As shown in FIG. 6, the microelectronic device 600 includes the microelectronic device structure 100 (including the various components thereof) previously described with reference to FIGS. 4A and 4B. The microelectronic device 600 further includes staircase structures 602 at horizontal ends (e.g., in the Y-direction) of the conductive stack structure 134. Each of the blocks 132 of the conductive stack structure 134 may individually include a staircase structure 602 having steps 604 at least partially defined by horizontal ends (e.g., edges) of the conductive tiers 136. The steps 604 of the staircase structures 602 may serve as contact regions to electrically couple the conductive structures 138 of the conductive tiers 136 to one or more other structures of the microelectronic device 600.

The microelectronic device 600 may also include access line contacts 606 (e.g., vertical word line contact structures) and select gate contacts 608 physically and electrically contacting the steps 604 of the staircase structures 602 to provide electrical access to the conductive structures 138 of the conductive tiers 136 of the conductive stack structure 134. The access line contacts 606 and the select gate contacts 608 may each individually be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe).

In addition, the microelectronic device 600 may include access lines 610 (e.g., word lines), select lines 612, and digit lines 634 (e.g., data lines, bit lines). The access lines 610 may electrically couple some of the conductive structures 138 (e.g., conductive structures 138 employed as access line plates) and the control device 114. The select lines 612 may electrically couple other of the conductive structures 138 (e.g., conductive structures 138 employed as select gate structures, such as SGD structures and SGS structures) and the control device 114. The digit lines 634 may overly the conductive stack structure 134, and may be electrically coupled to the control device 114. The access lines 610, the select lines 612, and the digit lines 634 may each individually be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe).

As shown in FIG. 6, the microelectronic device 600 may further include strings 614 of memory cells 616 vertically coupled to each other in series. The strings 614 of memory cells 616 may vertically extend through the conductive stack structure 134. Each of the strings 614 of memory cells 616 may include one of the first pillar structures 104 (e.g., a vertically-extending pillar structure including semiconductive pillar such as a polysilicon pillar or a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the first pillar structures 104 and the conductive structures 138 of the conductive tiers 136 of the conductive stack structure 134 may define the memory cells 616 of the string 614. In some embodiments, the memory cells 616 comprise so-called "MONOS" (metal-oxide-nitride-oxide-semiconductor) memory cells. In additional embodiments, the memory cells 616 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 616 comprise so-called "floating gate" memory cells including floating gates (e.g., metallic floating gates) as charge storage structures.

The floating gates may horizontally intervene between central structures of the first pillar structures 104 and the conductive structures 138 of the different conductive tiers 136 of the conductive stack structure 134. The strings 614 of memory cells 616 may be electrically coupled to and may vertically extend between the digit lines 634 and the source structure 116. As shown in FIG. 6, the control device 114 may vertically underlie (e.g., in the Z-direction) and may be at least partially positioned within horizontal boundaries of a region of the conductive stack structure 134 containing the strings 614 of memory cells 616.

Thus, in accordance with embodiments of the disclosure, a microelectronic device comprises a stack structure comprising vertically alternating insulating structures and conductive structures arranged in tiers. Each of the tiers individually comprising one of the insulating structures and one of the conductive structures. The microelectronic device comprises at least one first filled trench substantially vertically extending through the stack structure and horizontally extending in a first direction, and second filled trenches substantially vertically extending through the stack structure and horizontally extending in a second direction orthogonal to the first direction. The second filled trenches divide the stack structure into an array of blocks. The second filled trenches intersect the at least one first filled trench at intersections. At least some of the intersections comprise Y-shaped intersections. The microelectronic device also comprises a dielectric structure within the at least one first filled trench and the second filled trenches, and pillar structures vertically extending through the stack structure. The pillar structures are aligned in columns extending in the second direction. At least some of the individual blocks of the array of blocks comprise an even number of the columns.

Figure 7:
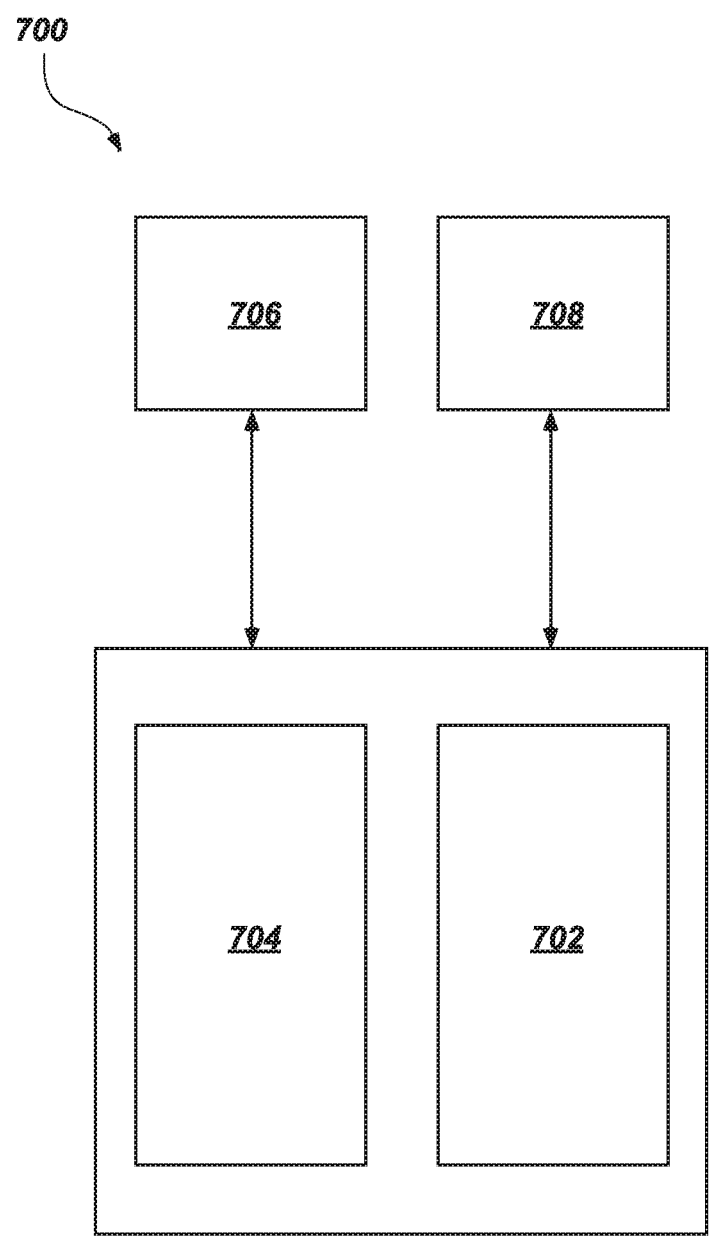
FIG. 7 is a schematic block diagram illustrating an electronic system, in accordance with embodiments of the disclosure.

Microelectronic devices (e.g., the microelectronic device 600 shown in FIG. 6) including microelectronic device structures (e.g., the microelectronic device structure 100 shown in FIGS. 4A and 4B) in accordance with embodiments of the disclosure may be used in embodiments of electronic systems of the disclosure. For example, FIG. 7 is a block diagram of an illustrative electronic system 700 according to embodiments of disclosure. The electronic system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 700 includes at least one memory device 702. The memory device 702 may comprise, for example, an embodiment of a microelectronic device (e.g., the microelectronic device 600 shown in FIG. 6) previously described herein. The electronic system 700 may further include at least one electronic signal processor device 704 (often referred to as a "microprocessor"). The electronic signal processor device 304 may, optionally, include an embodiment a microelectronic device (e.g., the microelectronic device 600 shown in FIG. 6) previously described herein. While the memory device 702 and the electronic signal processor device 704 are depicted as two (2) separate devices in FIG. 7, in additional embodiments, a single (e.g., only one) memory/processor device having the functionalities of the memory device 702 and the electronic signal processor device 704 is included in the electronic system 700. In such embodiments, the memory/processor device may include an embodiment of a microelectronic device structure (e.g., the microelectronic device structure 100 shown in FIGS. 4A and 4B) previously described herein, and/or an embodiment of a microelectronic device (e.g., the microelectronic device 600 shown in FIG. 6) previously described herein. The electronic system 700 may further include one or more input devices 706 for inputting information into the electronic system 700 by a user, such as, for example, a mouse or other pointing device, a keyboard, a touchpad, a button, or a control panel. The electronic system 700 may further include one or more output devices 708 for outputting information (e.g., visual or audio output) to a user such as, for example, a monitor, a display, a printer, an audio output jack, a speaker, etc. In some embodiments, the input device 706 and the output device 708 may comprise a single touchscreen device that can be used both to input information to the electronic system 700 and to output visual information to a user. The input device 706 and the output device 708 may communicate electrically with one or more of the memory device 702 and the electronic signal processor device 704.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising tiers each comprising an electrically conductive structure and a dielectric structure vertically neighboring the electrically conductive structure; at least one filled trench substantially extending through the stack structure; at least two additional filled trenches substantially extending through the stack structure and intersecting the at least one filled trench; at least one dielectric structure within the at least one filled trench and the at least two additional filled trenches; and memory pillars extending through the stack structure. The memory pillars are separated into blocks between the at least two additional filled trenches. Individual blocks of the memory pillars are separated from one another with one of a T-shaped intersection and a Y-shaped intersection.

The methods, structures (e.g., the microelectronic device structure 100), devices (e.g., the microelectronic device 600), and systems (e.g., the electronic system 700) of the disclosure advantageously facilitate one or more of improved performance, reliability, and durability, lower costs, increased miniaturization of components, improved pattern quality, and greater packaging density as compared to conventional structures, conventional devices, and conventional systems. The methods and structures of the disclosure may substantially alleviate problems related to the formation and processing of conventional microelectronic device structures including conductive stack structures. For example, the methods and structures of the disclosure may reduce the risk of undesirable current leakage and short circuits by impeding undesirable tier deformations (e.g., tier warping) and/or tier collapse during the formation of the conductive tiers of the conductive stack structures as compared to conventional methods and conventional structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A method of forming a microelectronic device, comprising:
    forming a stack structure comprising vertically alternating insulating structures and additional insulating structures arranged in tiers, each of the tiers individually comprising one of the insulating structures and one of the additional insulating structures;
    forming pillar structures vertically extending through the stack structure;
    forming at least one trench substantially vertically extending through the stack structure and horizontally extending in a first direction;
    forming additional trenches substantially vertically extending through the stack structure and horizontally extending in a second direction transverse to the first direction, the additional trenches intersecting the at least one trench at intersections and dividing the stack structure into an array of blocks, the pillar structures aligned in columns extending in the second direction with at least some of the individual blocks of the array of blocks comprising an even number of the columns, and each of the additional trenches comprising:
        a first portion having a first width; and
        a second portion at a horizontal boundary of the first portion and having a second width greater than the first width;
    forming a dielectric structure within the at least one trench and the additional trenches, the dielectric structure comprising at least one angled portion proximate the horizontal boundary of the first portion of at least some of the additional trenches, the at least one angled portion extending at an acute angle to each of the first direction and the second direction; and
    selectively replacing the additional insulating structures with conductive material to form conductive structures.

2. The method of claim 1, wherein forming the additional trenches comprises:
    forming the first portion of the additional trenches to exhibit a substantially rectangular horizontal cross-sectional shape; and
    forming the second portion of at least some of the additional trenches to exhibit a substantially triangular horizontal cross-sectional shape.

3. The method of claim 1, wherein forming the at least one trench and the additional trenches substantially vertically extending through the stack structure comprises forming the at least one trench and the additional trenches from a vertically uppermost boundary of a vertically uppermost tier of the stack structure to a vertically lowermost boundary of a vertically lowermost tier of the stack structure.

4. The method of claim 1, wherein forming the dielectric structure within the at least one trench and the additional trenches comprises forming the dielectric structure to substantially completely fill each of the at least one trench and the additional trenches.

5. The method of claim 1, wherein neighboring blocks of the array of blocks are separated from one another in the first direction by one of the additional trenches.

6. The method of claim 1, wherein forming the pillar structures comprises staggering adjacent columns of the pillar structures such that a first column of aligned pillar structures is horizontally offset in the second direction from a second column of aligned pillar structures immediately adjacent to the first column.

7. The method of claim 1, wherein forming the pillar structures comprises forming memory pillar structures comprising a channel material of a cell film surrounding a fill material.

8. The method of claim 1, wherein at least one notch is formed in the at least one angled portion of the dielectric structure.

9. The method of claim 1, wherein selectively replacing the additional insulating structures with the conductive material comprises:
    selectively removing one or more portions of the additional insulating structures of the stack structure exposed by the at least one trench and the additional trenches; and
    filling spaces previously occupied by the one or more portions of the additional insulating structures with the conductive material to form the conductive structures prior to forming the dielectric structure.

10. The method of claim 1, wherein forming a stack structure comprises forming the stack structure vertically over a control device comprising complementary metal oxide semiconductor (CMOS) circuitry.

11. The method of claim 10, further comprising forming a source tier vertically between the control device and the stack structure, the source tier comprising a conductive source structure and another insulating structure vertically adjacent the conductive source structure.

12. A microelectronic device, comprising:
    a stack structure comprising vertically alternating insulating structures and conductive structures arranged in tiers, each of the tiers individually comprising one of the insulating structures and one of the conductive structures;
    at least one first filled trench substantially vertically extending through the stack structure and horizontally extending in a first direction;
    second filled trenches substantially vertically extending through the stack structure and horizontally extending in a second direction orthogonal to the first direction, the second filled trenches dividing the stack structure into an array of blocks, wherein the second filled trenches intersect the at least one first filled trench at intersections, at least some of the intersections comprising Y-shaped intersections;

a dielectric structure within the at least one first filled trench and the second filled trenches; and pillar structures vertically extending through the stack structure, the pillar structures aligned in columns extending in the second direction, at least some of the individual blocks of the array of blocks comprising an even number of the columns.

13. The microelectronic device of claim 12, wherein each of the second filled trenches comprises:

a first portion substantially linearly extending in the second direction and having a first width in the first direction; and a second portion at a horizontal boundary of the first portion in the second direction and exhibiting a second width in the first direction greater than the first width.

14. The microelectronic device of claim 13, wherein at least some of the second filled trenches comprise reduced portions proximate the intersections, the reduced portions exhibiting a third width in the first direction less than each of the first width and the second width.

15. The microelectronic device of claim 12, wherein at least some of the intersections comprise T-shaped intersections, the T-shaped intersections alternating with the Y-shaped intersections in the first direction.

16. The microelectronic device of claim 12, wherein each of the Y-shaped intersections comprises first linear portions and second linear portions, the first linear portions extending at an angle of between about 35 degrees and about 55 degrees from the first direction, and the second linear portions extending at an angle of between about 35 degrees and about 55 degrees from the first direction.

17. The microelectronic device of claim 12, wherein the columns of the pillar structures comprise at least one first column horizontally neighboring one of the Y-shaped intersections and at least one second column horizontally neighboring the at least one first column.

18. The microelectronic device of claim 17, wherein a first pillar structure of the at least one first column is located farther from the at least one first filled trench relative to a first pillar structure of the at least one second column.

19. The microelectronic device of claim 12, further comprising:

conductive lines overlying the stack structure;

a source structure underlying the stack structure; and a control device electrically coupled to the conductive structures of the stack structure, the conductive lines, and the source structure, wherein the pillar structures comprise strings of memory cells electrically coupled to the conductive lines and the source structure.

20. The microelectronic device of claim 19, wherein the control device comprises CMOS circuitry and is at least partially positioned within horizontal boundaries of and vertically below a region of the stack structure containing the strings of memory cells.

21. An electronic system, comprising:

an input device;

an output device;

a processor device operably coupled to the input device and the output device; and a memory device operably coupled to the processor device and comprising at least one microelectronic device structure comprising:

a stack structure comprising tiers each comprising an electrically conductive structure and a dielectric structure vertically neighboring the electrically conductive structure;

at least one filled trench substantially extending through the stack structure;

at least two additional filled trenches substantially extending through the stack structure and intersecting the at least one filled trench;

at least one dielectric structure within the at least one filled trench and the at least two additional filled trenches; and memory pillars extending through the stack structure, the memory pillars separated into blocks between the at least two additional filled trenches, wherein individual blocks of the memory pillars are separated from one another with one of a T-shaped intersection and a Y-shaped intersection.

22. The electronic system of claim 21, further comprising:

a source below the tiers of the stack structure, the source operably coupled to the memory pillars, wherein the electrically conductive structure of the tiers are operably coupled to the source; and complementary metal-oxide-semiconductor circuitry below the source.

23. The electronic system of claim 21, wherein the T-shaped intersection horizontally neighbors two Y-shaped intersections and the Y-shaped intersection horizontally neighbors two T-shaped intersections.

24. The electronic system of claim 21, wherein at least two Y-shaped intersections horizontally neighbor one another.

25. The electronic system of claim 21, wherein each of the individual blocks of the memory pillars are separated from one another with a Y-shaped intersection.

26. The electronic system of claim 21, wherein the memory device comprises a 3D NAND Flash memory device.

* * * * *